US010333511B2

(12) United States Patent
Hietala et al.

(10) Patent No.: US 10,333,511 B2
(45) Date of Patent: Jun. 25, 2019

(54) DUAL-LEVEL POWER-ON RESET (POR) CIRCUIT

(71) Applicant: Qorvo US, Inc., Greensboro, NC (US)

(72) Inventors: Alexander Wayne Hietala, Phoenix, AZ (US); Christopher Truong Ngo, Queen Creek, AZ (US); Praveen Varma Nadimpalli, Chandler, AZ (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/704,789

(22) Filed: Sep. 14, 2017

(65) Prior Publication Data

US 2018/0076810 A1    Mar. 15, 2018

Related U.S. Application Data

(60) Provisional application No. 62/394,266, filed on Sep. 14, 2016.

(51) Int. Cl.
*H03K 17/22* (2006.01)
*G05F 3/08* (2006.01)
*H01L 23/525* (2006.01)

(52) U.S. Cl.
CPC ........... *H03K 17/223* (2013.01); *G05F 3/08* (2013.01); *H01L 23/5256* (2013.01)

(58) Field of Classification Search
CPC .................................................. H03K 17/223
See application file for complete search history.

(56) References Cited

U.S. PATENT DOCUMENTS

| 5,936,443 | A | * | 8/1999 | Yasuda | ................ | H03K 17/223 |
| | | | | | | 327/143 |
| 8,253,452 | B2 | * | 8/2012 | Kushnarenko | ............ | G05F 3/30 |
| | | | | | | 327/143 |
| 2007/0001720 | A1 | * | 1/2007 | Li | ............................. | G06F 1/28 |
| | | | | | | 327/143 |

* cited by examiner

*Primary Examiner* — Daniel C Puentes
(74) *Attorney, Agent, or Firm* — Withrow & Terranova, P.L.L.C.

(57) ABSTRACT

An integrated circuit (IC) including a first power-on reset (POR) circuit and a second POR circuit is disclosed. The first POR circuit is configured to enable the second POR circuit when a supply voltage initially exceeds a first threshold voltage as the supply voltage is being applied to the IC. The second POR circuit is configured to activate a first section of circuitry when the second POR circuit is enabled by the first POR circuit and the supply voltage initially exceeds a second threshold voltage as the supply voltage is being applied to the IC. Since a POR threshold voltage can affect current drain and/or operational functions of an IC, having the first POR circuit configured to enable the second POR circuit and having the second POR circuit configured to activate the first section of the main circuitry allows the IC to operate properly while reducing current drain.

26 Claims, 3 Drawing Sheets

DUAL-LEVEL POWER-ON RESET (POR) CIRCUIT

PRIORITY APPLICATION

Figure 1:
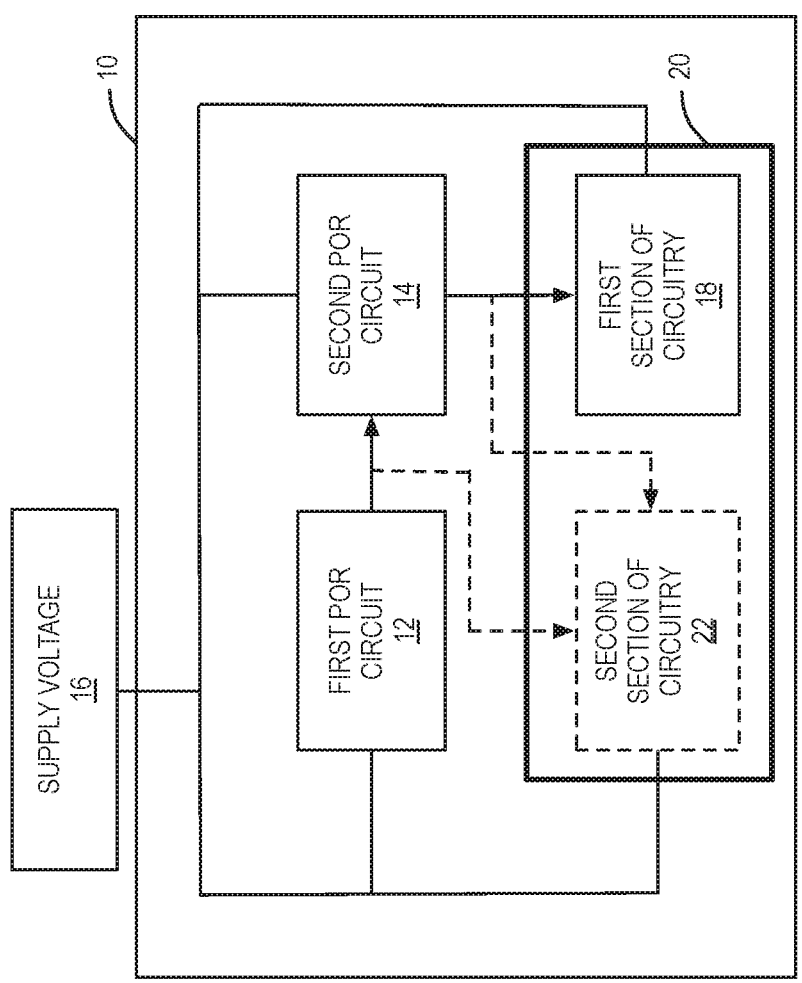

This application claims the benefit of provisional patent application Ser. No. 62/394,266, filed Sep. 14, 2016, the disclosure of which is hereby incorporated herein by reference in its entirety.

FIELD OF THE DISCLOSURE

The technology of the disclosure relates generally to power-on reset (POR) circuits and more particularly to circuits including multiple POR circuits.

BACKGROUND

In many integrated circuits (ICs), a power-on reset (POR) circuit is provided in association with the main circuitry of the IC. The POR circuit ensures that the main circuitry starts functioning in a consistent and known state upon being powered on. When power is applied to a system in which the IC resides, the supply voltage will rise to a normal operating level that exceeds a level sufficient for operation of the main circuitry. However, as the supply voltage rises to the normal operating level, the main circuitry cannot function properly, and even after the supply voltage reaches the normal operating level, the main circuitry is not guaranteed to start functioning in a consistent and known state.

As the supply voltage rises after power is applied, the POR circuit detects when the supply voltage exceeds a POR threshold voltage, which corresponds to an acceptable operating level for the main circuitry and provides a POR signal. The POR signal is used to reset all or part of the main circuitry and/or trigger a function provided by the main circuitry once the supply voltage has reached the acceptable operating level. The acceptable operating level is generally lower than the normal operating level, and as such, the POR signal may be provided as the supply voltage continues to rise above the acceptable operating level to the normal operating level. Thus, the POR circuit ensures that the supply voltage has reached an acceptable operating level for the main circuitry prior to providing the POR signal to reset the main circuitry and/or trigger certain functions to ensure proper operation of the main circuitry after being powered on.

Energy efficiency is a top priority for many applications. Once a system is powered on, the system cycles between on and standby states. In the on state, the system provides normal functions and draws more current. In the standby state, the system goes into a very low current mode with significantly reduced functionality. For many ICs, the POR circuit is a dominant contributor to current draw in standby mode. Unfortunately, reducing the current draw of the existing POR circuits tends to increase the variability of the POR threshold voltage from one POR circuit to another due to process and temperature variations.

If the POR threshold voltage is too low, reset functions or other functions may not be properly activated because the supply voltage may not reach the level needed to operate the main circuitry. This may result in an operational malfunction or excessive current drain while the supply voltage is rising. Typically, if the rise time of the supply voltage is fast enough, then even if the POR threshold voltage is low, the main circuitry will operate properly because the supply voltage rises to acceptable levels quickly after the POR signal is provided. However, for those systems that have relatively slow rise times on the supply voltage, sporadic failures can occur when the POR threshold voltage is too low. Thus, a fast rise time of the supply voltage cannot be relied upon to compensate for a POR threshold voltage that can vary to excessively low levels. Further, the POR threshold voltage typically may not be set higher to avoid potential issues with a low POR threshold voltage because a POR threshold voltage that is too high may result in the POR signal never being triggered or being triggered too late.

SUMMARY

The present disclosure relates to a dual-level power-on reset (POR) circuit. Related devices, methods, and systems are also disclosed. An integrated circuit (IC) including a first POR circuit and a second POR circuit is disclosed. The first POR circuit is configured to enable the second POR circuit when a supply voltage initially exceeds a first threshold voltage as the supply voltage is being applied to the IC. The second POR circuit is configured to activate a first section of circuitry of a main circuitry when the second POR circuit is enabled by the first POR circuit and the supply voltage initially exceeds a second threshold voltage as the supply voltage is being applied to the IC.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figure 2:
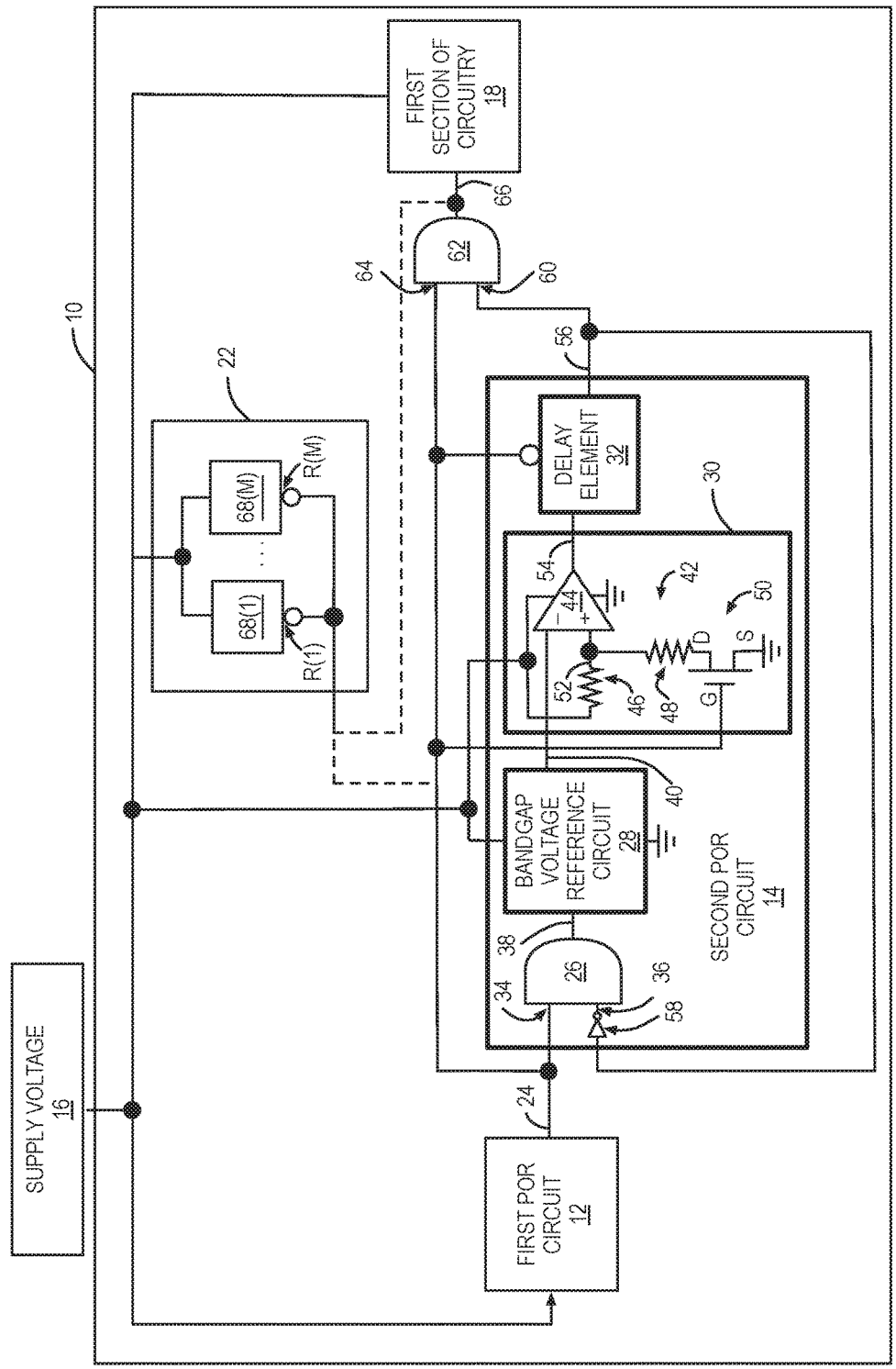
Figure 3:
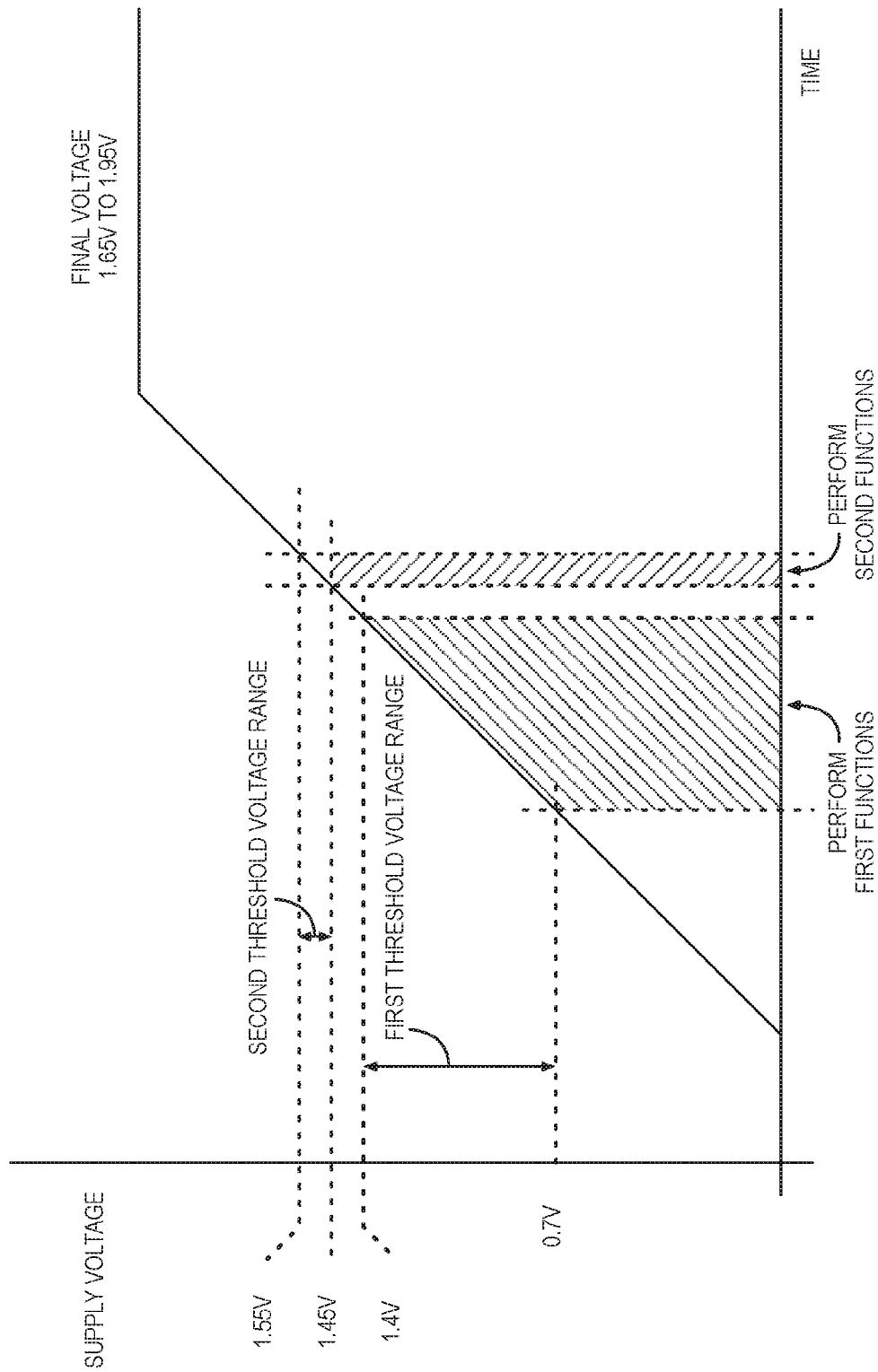

FIG. 1 is a dual-level power-on reset (POR) block diagram illustrating a first POR circuit and a second POR circuit, wherein the first POR circuit is configured to enable the second POR circuit when a supply voltage initially exceeds a first threshold voltage, and the second POR circuit is configured to activate a first section of circuitry when enabled and when the supply voltage initially exceeds a second threshold voltage;

FIG. 2 is a detailed circuit diagram of the dual-level POR block diagram illustrated in FIG. 1; and FIG. 3 is a graph illustrating a first threshold voltage range of the first POR circuit and a second threshold voltage range of the second POR circuit during a rising supply voltage transient.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates an exemplary IC 10, which includes dual-level POR circuitry according to one embodiment. The IC 10 includes a first POR circuit 12 and a second POR circuit 14. The first POR circuit 12 is configured to enable the second POR circuit 14 when a supply voltage 16 initially exceeds a first threshold voltage as the supply voltage 16 is being applied to the IC 10. The second POR circuit 14 is configured to activate (i.e. reset) a first section of circuitry 18 of main circuitry 20 when the second POR circuit 14 is enabled by the first POR circuit 12 and the supply voltage 16 initially exceeds a second threshold voltage as the supply voltage 16 is being applied to the IC 10.

The main circuitry 20 may also have a second section of circuitry 22, which can be run relatively independently of the first section of circuitry 18. In one embodiment, first POR circuit 12 is configured to activate (i.e. reset) the second section of circuitry 22 concurrently with enabling the second POR circuit 14. As a result, the second section of circuitry 22 is activated, or reset, as the supply voltage 16 exceeds the first threshold voltage, and the first section of circuitry 18 is activated, or reset, as the supply voltage 16 exceeds the second threshold voltage, which is often higher than the first supply voltage. This scenario proves helpful when the second section of circuitry 22 needs to be activated before the first section of circuitry 18 and/or the second section of circuitry 22 is able to operate at a lower supply voltage level than the first section of circuitry 18. In other embodiments, the second POR circuit 14 may be configured to activate, or reset, the second section of circuitry 22 in addition to the first section of circuitry 18. As such, both the first and second sections of circuitry 18 and 22 are activated at approximately the same time and at the same supply voltage level.

FIG. 2 illustrates a more detailed circuit diagram of the exemplary IC 10 illustrated in FIG. 1. In particular, the IC 10 in FIG. 2 includes the first POR circuit 12 configured to sense the supply voltage 16 and generate a first output signal on a node 24 when the supply voltage 16 exceeds the first threshold voltage. The first threshold voltage for the first POR circuit 12 is a design choice and may be the same as or less than the second threshold voltage of the second POR circuit 14. An exemplary first threshold voltage may include a voltage such as, but not limited to, a voltage in a range of 0.7 volts (V) to 1.4 V, a voltage in a range of 0.5 to 1.7, or a voltage less than 2V. An exemplary first threshold voltage may also include a voltage such as, but not limited to, 0.7 V, 0.75 V, 0.8 V, 0.85 V, 0.9 V, 0.95 V, 1.0 V, 1.05 V, 1.1 V, 1.15 V, 1.2 V, 1.25 V, 1.3V, 1.35 V, and approximately 1.4 V.

The first output signal generated by the first POR circuit 12 is received by the second POR circuit 14 coupled to the node 24. The second POR circuit 14 includes a first logic gate 26 (an AND gate), a reference circuit in the form of a bandgap voltage reference circuit 28, a comparator circuit 30, and a delay element 32. In some embodiments, the second POR circuit 14 may not include the first logic gate 26 and/or the delay element 32. In this example, a first input 34 of the first logic gate 26 is coupled to the node 24. The first logic gate 26 is configured to receive the first output signal from the first POR circuit 12 and, since a second input 36 of the first logic gate 26 is configured to already be asserted, generate an output signal on a node 38.

The bandgap voltage reference circuit 28 is coupled to the node 38 such that it is configured to receive the output signal of the first logic gate 26. Upon receiving the output signal generated by the first logic gate 26, the bandgap voltage reference circuit 28 is enabled to generate a reference voltage on a node 40. In this example, the reference voltage is approximately 1.2 V, but may also be a voltage such as, but not limited to, 1.1 V, 1.2 V, and/or 1.3 V. Since a bandgap voltage reference circuit can provide a voltage (i.e., the reference voltage) that is independent of process variation, supply voltage variation, and temperature variation, variances in threshold voltage that conventional POR circuits may experience can be reduced or eliminated with the disclosed approach. In this regard, the manner in which the supply voltage 16 is applied to the first section of circuitry 18 can be more finely controlled than when using conventional POR circuits because the second threshold voltage can be limited to a narrower range of operational voltages. An exemplary second threshold voltage may include a voltage such as, but not limited to, a voltage in a range of 1.45 V to 1.55 V, a voltage greater than 1.45 V and less than 1.55 V, and/or a voltage greater than 1.45V. An exemplary second threshold voltage may also include a voltage such as, but not limited to, 1.45 V, 1.5 V, and approximately 1.55 V. In some embodiments, the first threshold voltage is less than 1.4 V and the second threshold voltage is greater than 1.45 V. In other embodiments, the second threshold voltage is greater than the first threshold voltage by differences such as, but not limited to, 0.1 V, 0.2 V, 0.3 V, 0.4 V, and/or 0.5 V.

The comparator circuit 30 in this example includes a voltage divider 42 and a comparator 44. The voltage divider 42 includes a first resistor 46 of a first resistance coupled to the supply voltage 16 and in series with a second resistor 48 of a second resistance, wherein the second resistor 48 is coupled to the drain (D) of a field-effect transistor (FET) 50. The first resistance may include values such as, but not limited to, 10 kilohms (KΩ), 20 KΩ, and/or 30 KΩ. The second resistance may include values such as, but not limited to, 40 KΩ, 80 KΩ, and/or 120 KΩ. The FET 50 may include FET structures such as, but not limited to, metal-oxide semiconductor (MOS) FETs (MOSFETs). In this arrangement, the voltage divider 42 is configured to generate a voltage that is a percentage of the supply voltage 16. The gate (G) of the FET 50 is coupled to the node 24. In this manner, the FET 50, and thus the voltage divider 42, is configured to be enabled by the first output signal generated on the node 24 from the first POR circuit 12.

A node 52 connecting the first resistor 46 and the second resistor 48 of the voltage divider 42 is coupled to a non-inverting input (+) of the comparator 44. The node 40 is coupled to an inverting input (−) of the comparator 44. In this manner, the comparator 44 is configured to receive the reference voltage generated by the bandgap voltage reference circuit 28 on the node 40. The comparator 44 is configured to generate an output signal on a node 54 based on the reference voltage and the supply voltage 16 when enabled. In this example, the comparator 44 is configured to generate a high output signal on the node 54 when the voltage generated by the voltage divider 42 (which is a percentage of the supply voltage 16) initially exceeds the reference voltage. The voltage generated by the voltage divider 42 may be a voltage such as, but not limited to, 1.15 V, 1.25 V, and/or 1.35 V.

In this example, the optional delay element 32 of the second POR circuit 14 is coupled to the node 54 such that the delay element 32 is configured to receive and be driven by the output signal of the comparator circuit 30. Due to the inverter before the delay element 32, the delay element 32 in this example can be configured to be enabled by a low-level signal on the node 24. However, a high-level signal may be used in alternative designs to enable the delay element 32 as well. The delay element 32 in this example is a timer and is configured to introduce a delay between the time the delay element 32 receives the output signal of the comparator circuit 30 and the time the delay element 32 generates an output signal on a node 56. The node 56 is coupled to an inverter 58, which is coupled to the second input 36 of the first logic gate 26. In this manner, the output signal generated by the delay element 32 can disable (i.e., turn off) the bandgap voltage reference circuit 28 to cut off the power used by the bandgap voltage reference circuit 28 and reduce the overall current drain of the second POR circuit 14 once the second POR circuit 14 has activated the first section of circuitry 18. In other words, the bandgap voltage reference circuit 28 (i.e., the reference circuit) is configured to be disabled based on the output signal of the comparator circuit 30. When the bandgap voltage reference circuit 28 is disabled, node 40 is moved to ground potential, allowing the comparator 44 to maintain a high-level output signal on the node 54. In this manner, the second POR circuit 14 is configured to maintain a high-level output signal unless the supply voltage 16 drops below the first threshold voltage.

The node 56 is also coupled to a second input 60 of a second logic gate 62. In this example, the second logic gate 62 is an AND gate. However, the second logic gate 62 may an alternative logic structure. A first input 64 of the second logic gate 62 is coupled to the node 24. In this manner, the second logic gate 62 is able to generate an output signal based on the first output signal of first POR circuit 12 and the output signal of the delay element 32. In this example, the second logic gate 62 is able to generate a high output signal on a node 66 after the first POR circuit 12 generates the first output signal on the node 24 and after the delay element 32 produces the output signal on the node 56. In other words, the second logic gate 62 in this example produces a high output signal when the supply voltage 16 exceeds both the first threshold voltage and the second threshold voltage.

The high output signal of the second logic gate 62 can activate, or reset, the first section of circuitry 18. The first section of circuitry 18 can be non-volatile memory such as an electronic fuse (eFuse). However, the first section of circuitry 18 may also be, but is not limited to, reset functionality and/or data load from memory. Activating the first section of circuitry 18 can include applying a pulse or signal with a desired level, transition, or the like. By having the first POR circuit 12 configured to enable the second POR circuit 14 when the supply voltage 16 reaches the first threshold voltage, and having the second POR circuit 14 configured to activate the first section of circuitry 18 when enabled and when the supply voltage 16 reaches the second threshold voltage, the IC 10 can be configured to reduce current drain while ensuring that the first and second sections of circuitry 18 and 22 are turned on at appropriate supply voltage levels.

In additional embodiments, such as the example in FIGS. 1 and 2, the first POR circuit 12 may be configured to activate the second section of circuitry 22 when the supply voltage 16 initially exceeds the first threshold voltage as the supply voltage 16 is being applied to the IC 10. The second section of circuitry 22 may include components such as, but not limited to, digital functions and/or analog functions. In this example, the second section of circuitry 22 includes multiple digital elements 68(1)-68(M). Due to the inverter before each multiple digital element 68(1)-68(M), the multiple digital elements 68(1)-68(M) in this example can be configured to be reset by a low-level signal on the node 24 or the node 66.

In this embodiment, the reset control lines R(1)-R(M) of the multiple digital elements 68(1)-68(M) are configured to be held low (i.e., a reset state is asserted) by either a low-level first output signal on the node 24 or by a low-level output signal of the second logic gate 62 on the node 66. In this manner, the multiple digital elements 68(1)-68(M) can remain in a reset state until the supply voltage 16 exceeds either the first threshold voltage or the second threshold voltage. When the supply voltage 16 exceeds either the first threshold voltage or the second threshold voltage, the reset control lines R(1)-R(M) can go high and the multiple digital elements 68(1)-68(M) can be released from the reset state to begin normal operation. Thus, the multiple digital elements 68(1)-68(M) can be held in a reset state until a supply voltage 16 is achieved where the multiple digital elements 68(1)-68(M) can safely operate and be released from the reset state. In alternative embodiments, however, a low-level signal from either the first output signal on the node 24 or the output signal of the second logic gate 62 on the node 66 may be used to activate the multiple digital elements 68(1)-68 (M).

Additional sections of circuitry, including sections of the main circuitry 20, may also be triggered by either the first POR circuit 12 and/or the second POR circuit 14.

FIG. 3 is a graph illustrating a first threshold voltage range of the first POR circuit 12 and a second threshold voltage range of the second POR circuit 14, as shown in FIG. 1, during a rising supply voltage transient. The threshold voltage of the first POR circuit 12 in FIG. 2 can occur in a range of 0.7 V to 1.4 V, wherein the first POR circuit 12 can enable the second POR circuit 14 and activate the second section of circuitry 22. The threshold voltage of the second POR circuit 14 can occur in a range of 1.45 V to 1.55 V, wherein the second POR circuit 14 can enable the first section of circuitry 18. It is possible that the maximum threshold voltage of the first POR circuit 12 could equal or slightly exceed the threshold voltage of the second POR circuit 14. In this case, the first POR circuit 12 would be activated first and the second POR circuit 14 would be activated almost immediately thereafter.

The exemplary final voltage of the supply voltage 16 in this example is in a range of 1.65 V to 1.95 V. When the supply voltage 16 falls (turns off or becomes transient), then the first POR circuit 12 may have a turn-off threshold voltage, which may be a voltage such as, but not limited to, a voltage in a range of 0.5 V to 0.7 V. Once this threshold is crossed, the digital circuitry can be reset. In this example, the digital circuitry can maintain memory elements with a voltage as low as 0.2 V, and thus, any data loaded from eFuses when the supply voltage 16 initially rises above the threshold voltage of the second POR circuit 14 may be maintained at voltages as low as the turn-off threshold voltage of the first POR circuit 12. This assists in protecting the memory from corruption due to supply voltage transients that stay above the turn-off threshold voltage of the first POR circuit 12.

Those skilled in the art will recognize improvements and modifications to the preferred embodiments of the present disclosure. All such improvements and modifications are considered within the scope of the concepts disclosed herein and the claims that follow.

What is claimed is:

1. An integrated circuit (IC) comprising:
main circuitry including a first section of circuitry and a second section of circuitry, which is able to be run independently of the first section of circuitry;
a first power-on reset (POR) circuit; and
a second POR circuit, wherein:
when a supply voltage is applied to the IC, the supply voltage is applied to both the first POR circuit and the second POR circuit;
the first POR circuit is configured to enable the second POR circuit when the supply voltage initially exceeds a first threshold voltage as the supply voltage is being applied to the IC;
the second POR circuit is configured to activate the first section of circuitry when the second POR circuit is enabled by the first POR circuit and the supply voltage initially exceeds a second threshold voltage as the supply voltage is being applied to the IC; and the second section of circuitry is configured to be activated by the first POR circuit when the supply voltage initially exceeds the first threshold voltage as the supply voltage is being applied to the IC, or the second section of circuitry is configured to be activated by the second POR circuit when the second POR circuit is enabled by the first POR circuit and the supply voltage initially exceeds the second threshold voltage as the supply voltage is being applied to the IC.

2. The IC of claim 1, wherein the second threshold voltage is greater than the first threshold voltage.

3. The IC of claim 2, wherein:
the first threshold voltage falls in a range of 0.7 volts (V) and less than 1.4 V; and
the second threshold voltage falls in a range of 1.45 V and less than 1.55 V.

4. The IC of claim 2, wherein:
the first threshold voltage is less than 1.4 V; and
the second threshold voltage is greater than 1.45 V.

5. The IC of claim 2, wherein the second threshold voltage is greater than the first threshold voltage by 0.1 V.

6. The IC of claim 2, wherein the second threshold voltage is greater than the first threshold voltage by 0.2 V.

7. The IC of claim 2, wherein the second threshold voltage is greater than the first threshold voltage by 0.3 V.

8. The IC of claim 1, wherein the first section of circuitry comprises an electronic fuse (eFuse).

9. The IC of claim 1, wherein:
the second section of circuitry is configured to be activated by the first POR circuit when the supply voltage initially exceeds the first threshold voltage as the supply voltage is being applied to the IC.

10. The IC of claim 9, wherein the second section of circuitry comprises a digital function.

11. The IC of claim 1, wherein the second POR circuit comprises:
a reference circuit configured to generate a reference voltage when enabled; and
a comparator circuit configured to generate an output signal based on the reference voltage and the supply voltage when enabled;
wherein the reference circuit and the comparator circuit are configured to be enabled when the second POR circuit is enabled.

12. The IC of claim 11, wherein the first section of circuitry is configured to be activated based on the output signal of the comparator circuit.

13. The IC of claim 11, wherein:
the reference circuit is a bandgap voltage reference circuit; and
the reference voltage is independent of process variation, supply voltage variation, and temperature variation.

14. The IC of claim 11, wherein a delay element is configured to be driven by the output signal of the comparator circuit.

15. The IC of claim 14, wherein the second POR circuit further comprises the delay element.

16. The IC of claim 14, wherein the reference circuit is configured to be disabled based on the output signal of the comparator circuit.

17. The IC of claim 16, wherein the first section of circuitry is configured to be activated based on the output signal of the comparator circuit.

18. The IC of claim 17, wherein the second threshold voltage is greater than the first threshold voltage.

19. The IC of claim 18, wherein:
the second section of circuitry is configured to be activated by the first POR circuit when the supply voltage initially exceeds the first threshold voltage as the supply voltage is being applied to the IC.

20. The IC of claim 14, wherein the first section of circuitry is configured to be activated based on the output signal of the comparator circuit.

21. The IC of claim 11, wherein the reference circuit is configured to be disabled based on the output signal of the comparator circuit.

22. The IC of claim 21, wherein the first section of circuitry is configured to be activated based on the output signal of the comparator circuit.

23. The IC of claim 22, wherein the second threshold voltage is greater than the first threshold voltage.

24. The IC of claim 23, wherein the second section of circuitry is configured to be activated by the first POR circuit when the supply voltage initially exceeds the first threshold voltage as the supply voltage is being applied to the IC.

25. The IC of claim 1, wherein the second section of circuitry is activated by the second POR circuit when the second POR circuit is enabled by the first POR circuit and the supply voltage initially exceeds the second threshold voltage as the supply voltage is being applied to the IC, such that the first section of circuitry and the second section of circuitry are activated at approximately a same time and at a same supply voltage.

26. The IC of claim 9, wherein the second threshold voltage is greater than the first threshold voltage, such that the first section of circuitry and the second section of circuitry are activated at different times and at different supply voltages.

* * * * *